United States Patent
Bertrand et al.

(10) Patent No.: US 9,297,860 B2
(45) Date of Patent: Mar. 29, 2016

(54) HIGH VOLTAGE SERVICE DISCONNECT ASSEMBLY AND METHOD FOR DETERMINING AN ISOLATION RESISTANCE FAULT OF A BATTERY PACK

(71) Applicants: Joseph Bertrand, Canton, MI (US); Daniel K. McNeill, Lake Orion, MI (US)

(72) Inventors: Joseph Bertrand, Canton, MI (US); Daniel K. McNeill, Lake Orion, MI (US)

(73) Assignee: LG Chem, Ltd., Seoul (KR)

( * ) Notice: Subject to any disclaimer, the term of this patent is extended or adjusted under 35 U.S.C. 154(b) by 652 days.

(21) Appl. No.: 13/692,705

(22) Filed: Dec. 3, 2012

(65) Prior Publication Data

US 2014/0152318 A1 Jun. 5, 2014

(51) Int. Cl.
*G01N 27/416* (2006.01)
*G01R 31/36* (2006.01)
*G01R 31/02* (2006.01)
*G01R 31/00* (2006.01)

(52) U.S. Cl.
CPC ............ *G01R 31/362* (2013.01); *G01R 31/025* (2013.01); *G01R 31/006* (2013.01)

(58) Field of Classification Search
CPC .................................................. G01R 31/3606
USPC ......................................................... 324/426
See application file for complete search history.

(56) References Cited

U.S. PATENT DOCUMENTS

| 1,966,716 A | 7/1934 | Green |
| D298,123 S | 10/1988 | Beard |
| 4,966,561 A | 10/1990 | Norden |
| 5,570,255 A | 10/1996 | Hirata |
| 5,831,228 A | 11/1998 | Kuki et al. |
| 5,841,337 A | 11/1998 | Douglass |
| 5,842,560 A | 12/1998 | Kuki et al. |
| 5,847,338 A | 12/1998 | Kuki et al. |
| 6,054,915 A | 4/2000 | Rowton et al. |
| 6,157,287 A | 12/2000 | Douglass et al. |
| 6,333,845 B1 | 12/2001 | Hashizawa et al. |

(Continued)

FOREIGN PATENT DOCUMENTS

| JP | H07220702 A | 8/1995 |
| JP | 9306302 A | 11/1997 |

(Continued)

OTHER PUBLICATIONS

International Search Report for International application No. PCT/KR2010/002332 dated Oct. 29, 2010.

*Primary Examiner* — Edward Tso
*Assistant Examiner* — Ahmed Omar
(74) *Attorney, Agent, or Firm* — Buckert Patent & Trademark Law Firm, PC; John F. Buckert

(57) ABSTRACT

A high voltage service disconnect assembly is provided. The battery pack has an enclosure, first and second battery modules, and positive and negative pack voltage terminals. The assembly includes a housing securing first and second conductive pins thereon. The first conductive pin is coupled to a negative voltage terminal of the first battery module. The second conductive pin is coupled to a positive voltage terminal of the second battery module. The assembly further includes a detection circuit electrically coupled to the first and second conductive pins. The detection circuit outputs a first isolation resistance fault signal when a first isolation resistance fault is detected between the negative pack voltage terminal and the enclosure.

17 Claims, 3 Drawing Sheets

(56) References Cited

U.S. PATENT DOCUMENTS

| | | |
|---|---|---|
| 6,366,449 B1 | 4/2002 | Hashizawa et al. |
| 6,407,656 B1 | 6/2002 | Konda et al. |
| 6,456,187 B2 | 9/2002 | Konda et al. |
| 6,459,353 B1 | 10/2002 | Mattlar et al. |
| 6,459,354 B2 | 10/2002 | Konda et al. |
| 6,531,948 B1 | 3/2003 | Mennell |
| 6,587,028 B2 | 7/2003 | Mollet et al. |
| 6,784,783 B2 | 8/2004 | Scoggin et al. |
| 6,853,289 B2 | 2/2005 | Scoggin |
| 7,304,453 B2 | 12/2007 | Eaves |
| 7,355,503 B2 | 4/2008 | Buettner |
| 7,750,789 B2 | 7/2010 | Titokis et al. |
| 7,893,809 B2 | 2/2011 | Head |
| 7,932,804 B2 | 4/2011 | Buettner |
| 7,948,353 B2 | 5/2011 | Deno et al. |
| 7,982,578 B2 | 7/2011 | Buettner |
| 8,098,126 B2 | 1/2012 | Niedzwiecki et al. |
| 8,288,031 B1 | 10/2012 | Matejek et al. |
| 2005/0098419 A1 | 5/2005 | Matsui et al. |
| 2008/0242150 A1 | 10/2008 | Chikamatsu et al. |
| 2010/0023872 A1 | 1/2010 | Marlow |
| 2012/0146661 A1* | 6/2012 | Thomas .................. 324/542 |
| 2012/0280697 A1 | 11/2012 | Morimoto |

FOREIGN PATENT DOCUMENTS

| | | | |
|---|---|---|---|
| JP | 2000251611 A | 9/2000 | |
| JP | 2000311576 A | 11/2000 | |
| JP | 2007103238 A | 4/2007 | |
| JP | 2007250386 A | 9/2007 | |
| JP | 2009037778 A | 2/2009 | |
| JP | 2010019603 A | 1/2010 | |
| KR | 20100027085 A | 3/2010 | |
| KR | 20120057385 A | 6/2012 | |
| WO | 2008033064 A | 3/2008 | |
| WO | WO2008/033064 A1 * | 3/2008 | ............ H01M 10/48 |

* cited by examiner

HIGH VOLTAGE SERVICE DISCONNECT ASSEMBLY AND METHOD FOR DETERMINING AN ISOLATION RESISTANCE FAULT OF A BATTERY PACK

BACKGROUND

When vehicle battery service personnel or vehicle emergency responders approach an electric vehicle, they currently cannot easily determine whether an isolation resistance fault is present in the electric vehicle. Accordingly, the inventors herein have recognized a need for a high voltage service disconnect assembly that provides a visual indication when an isolation resistance fault is present in the electric vehicle.

SUMMARY

A high voltage service disconnect assembly for determining an isolation resistance fault of a battery pack in accordance with an exemplary embodiment is provided. The battery pack has an enclosure, a first battery module, a second battery module, a positive pack voltage terminal, and a negative pack voltage terminal. The high voltage service disconnect assembly includes a housing configured to secure first and second conductive pins thereon. The first conductive pin is configured to be removably electrically coupled to a negative voltage terminal of the first battery module. The second conductive pin is configured to be removably electrically coupled to a positive voltage terminal of the second battery module. The high voltage service disconnect assembly further includes a detection circuit disposed in the housing and electrically coupled to the first and second conductive pins. The detection circuit is configured to output a first isolation resistance fault signal when a first isolation resistance fault is detected between the negative pack voltage terminal and the enclosure. The high voltage service disconnect assembly further includes a first light emitting device electrically coupled to the detection circuit. The first light emitting device is configured to emit light in response to the first isolation resistance fault signal.

A method for determining an isolation resistance fault of a battery pack utilizing a high voltage service disconnect assembly in accordance with another exemplary embodiment is provided. The battery pack has an enclosure, a first battery module, a second battery module, a positive pack voltage terminal, and a negative pack voltage terminal. The high voltage service disconnect assembly has a housing, a detection circuit, and a first light emitting device. The housing is configured to secure first and second conductive pins thereon. The first conductive pin is configured to be removably electrically coupled to a negative voltage terminal of the first battery module. The second conductive pin is configured to be removably electrically coupled to a positive voltage terminal of the second battery module. The method includes outputting a first isolation resistance fault signal from the detection circuit when a first isolation resistance fault is detected between the negative pack voltage terminal and the enclosure. The detection circuit is electrically coupled to the first and second conductive pins. The method further includes emitting light from the first light emitting device electrically coupled to the detection circuit in response to the first isolation resistance fault signal.

DETAILED DESCRIPTION

Figure 1:
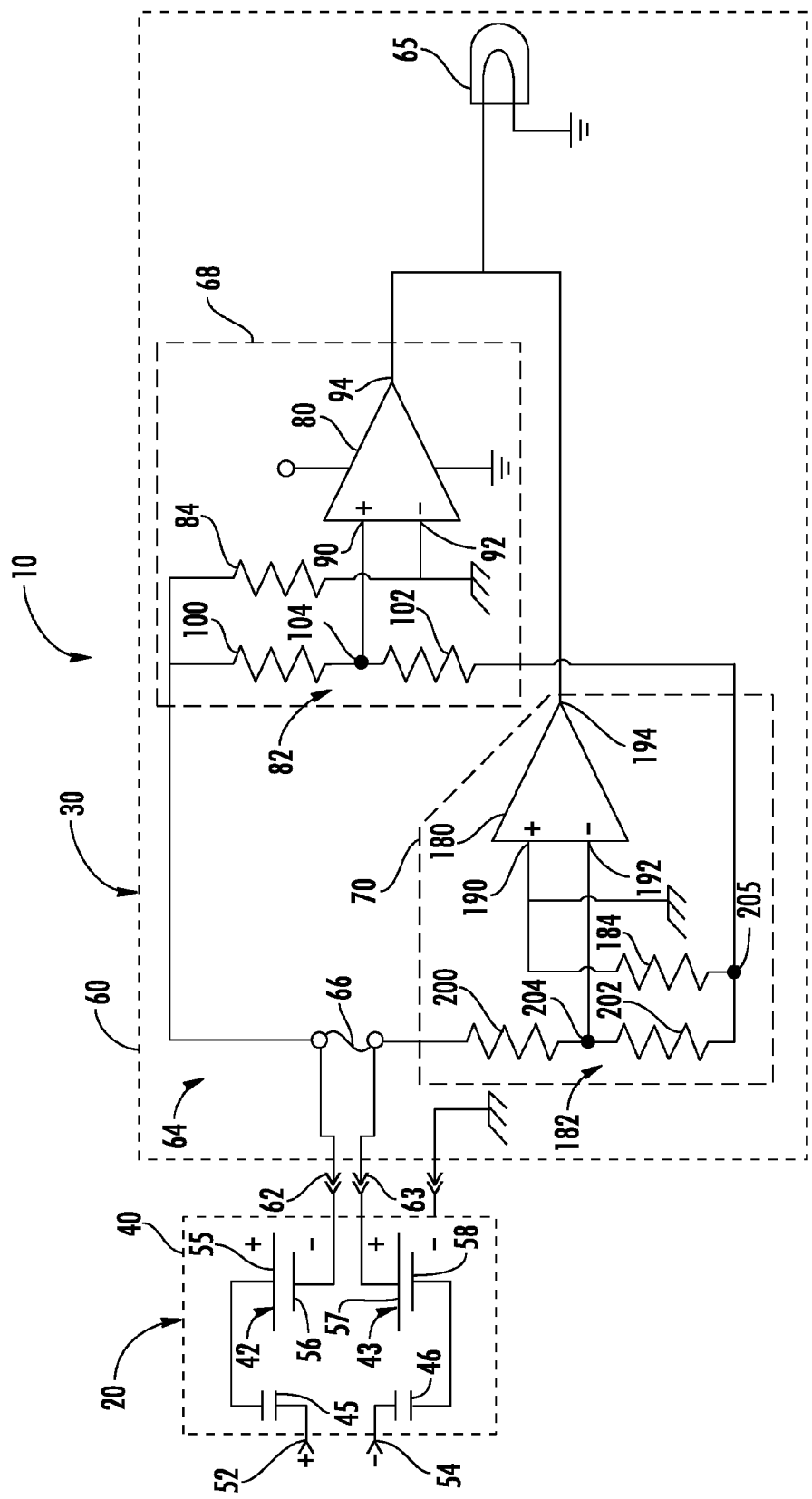
FIG. 1 is a schematic of an electric vehicle having a battery pack and a high voltage service disconnect assembly in accordance with an exemplary embodiment.
Figure 2:
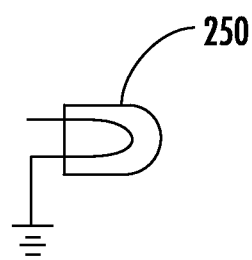
FIG. 2 is a schematic of a light emitting device utilized in an alternative high voltage service disconnect assembly.

Referring to FIGS. 1 and 2, an electric vehicle power system 10 having a battery pack 20, and a high voltage service disconnect assembly 30 in accordance with an exemplary embodiment is provided. An advantage of the high voltage service disconnect assembly 30 is that the assembly 30 can effectively and quickly determine an isolation resistance fault in an electric vehicle and provide a visual indication of the isolation resistance fault.

For purposes of understanding, an isolation resistance is measured in Ohms/volt. An isolation resistance fault occurs when an isolation resistance between two locations is less than a threshold isolation resistance.

The battery pack 20 is provided to generate an operational voltage for the electric vehicle 10. The battery pack 20 includes an enclosure 40, a first battery module 42, a second battery module 43, contactors 45, 46, a positive pack voltage terminal 52, and a negative pack voltage terminal 54. The positive pack voltage terminal 52 and the negative pack voltage terminal 54 extend outwardly from the housing. The enclosure 40 can be physically coupled to a vehicle chassis (not shown). The first battery module 42 has a positive voltage terminal 55 and a negative voltage terminal 56. The positive voltage terminal 55 is electrically coupled through the contactor 45 to the positive pack voltage terminal, when the contactor 45 has a closed operational position. The second battery module 43 has a positive voltage terminal 57 and a negative voltage terminal 58. The negative voltage terminal 58 is electrically coupled through the contactor 46 to the negative pack voltage terminal 54, when the contactor 46 has a closed operational position.

In an alternative embodiment, the battery pack 20 could have a plurality of additional battery modules electrically coupled in series between the contactor 45 and the first battery module 42. Also, the battery pack 20 could have a plurality of additional battery modules electrically coupled in series between the contactor 46 and the second battery module 43.

The high voltage service disconnect assembly 30 is configured to removably electrically couple the first battery module 42 to the second battery module 43 via the fuse 66. The high voltage service disconnect assembly 30 is further configured to determine whether an isolation resistance fault exists between the positive pack voltage terminal 52 and the enclosure 40, and whether an isolation resistance fault exists between the negative pack voltage terminal 54 and the enclosure 40. The high voltage service disconnect assembly 30 includes a housing 60, first and second conductive pins 62, 63, a detection circuit 64, the light emitting device 65, and a fuse 66. In an alternative embodiment, the assembly 30 does not utilize the fuse 66 and an electrical short circuit is present between the first and second conductive pins 62, 63.

The housing 60 is configured to secure the first and second conductive pins 62, 63 thereon. The first conductive pin 62 is configured to be removably electrically coupled to the negative voltage terminal 56 of the first battery module 42. The second conductive pin 63 is configured to be removably electrically coupled to the positive voltage terminal 57 of the second battery module 43.

The detection circuit 64 is disposed in the housing 60 and is electrically coupled to the first and second conductive pins 62, 63. The detection circuit 64 is configured to output a first isolation resistance fault signal when a first isolation resistance fault is detected between the negative pack voltage terminal 54 and the enclosure 40. The detection circuit 64 is further configured to output a second isolation resistance fault signal when a second isolation resistance fault has been detected between the positive pack voltage terminal 52 and the enclosure 40. The detection circuit 64 includes a first comparator circuit 68 and a second comparator circuit 70.

The first comparator circuit 68 is configured to determine whether an isolation resistance fault exists between the negative pack voltage terminal 54 and the enclosure 40. The first comparator circuit 68 includes a first comparator 80, a first voltage divider circuit 82, and a resistor 84. The first comparator 80 includes a non-inverting input terminal 90, an inverting input terminal 92, and an output terminal 94. The non-inverting input terminal 90 is electrically coupled through the first voltage divider circuit 82 to the negative voltage terminal 56 of the first battery module 42. In particular, the first voltage divider circuit 82 includes resistors 100, 102 electrically coupled in series between the negative voltage terminal 56 and an electrical node 205. The first voltage divider circuit 82 further includes an electrical node 104 electrically coupled between the resistors 100, 102. The electrical node 104 is further electrically coupled to the non-inverting input terminal 90 such that the non-inverting input terminal 90 is electrically coupled through the first voltage divider circuit 82 to the negative voltage terminal 56. The inverting input terminal 92 is electrically coupled to the enclosure 40. The inverting input terminal 92 is further electrically coupled through the resistor 84 to the negative voltage terminal 56. The first comparator 80 is configured to output a first isolation resistance fault signal on the output terminal 94 when a first voltage on the non-inverting input terminal 90 is greater than a second voltage on the inverting input terminal 92 indicating that a first isolation resistance fault has been detected between the negative pack voltage terminal 54 and the enclosure 40. In one exemplary embodiment, the resistors 100, 102 each have a resistance of 100 kilo-Ohms, and the resistor 84 has a resistance of 100 mega-Ohms.

The light emitting device 65 is electrically coupled to the output terminal 94 of the first comparator 80. The light emitting device 65 is configured to emit light in response to the first isolation resistance fault signal. In one exemplary embodiment, the light emitting device 65 is a light emitting diode (LED). However, in alternative embodiments, other light emitting apparatuses known to those skilled in the art could be utilized.

The second comparator circuit 70 is configured to determine whether an isolation resistance fault exists between the positive pack voltage terminal 52 and the enclosure 40. The second comparator circuit 70 has a second comparator 180, a second voltage divider circuit 182, and a resistor 184. The second comparator 180 has a non-inverting input terminal 190, an inverting input terminal 192, and an output terminal 194. The inverting input terminal 192 is electrically coupled through the second voltage divider circuit 182 to the positive voltage terminal 57 of the second battery module 43. In particular, the second voltage divider circuit 182 includes resistors 200, 202 electrically coupled in series between the positive voltage terminal 57 of the second battery module 43 and the electrical node 205. The second voltage divider circuit 182 further includes an electrical node 204 electrically coupled between the resistors 200, 202. The electrical node 204 is electrically coupled to the inverting input terminal 192 such that the inverting input terminal 192 is electrically coupled through the second voltage divider circuit 182 to the positive voltage terminal 57. The non-inverting input terminal 190 is electrically coupled to the enclosure 40. The non-inverting input terminal 190 is further electrically coupled through the resistor 184 to the electrical node 205. The second comparator 180 is configured to output a second isolation resistance fault signal on the output terminal 194 when a third voltage on the non-inverting input terminal 190 is greater than a fourth voltage on the inverting input terminal 192 indicating that a second isolation resistance fault has been detected between the positive pack voltage terminal 52 and the enclosure 40. In one exemplary embodiment, the resistors 200, 202 each have a resistance of 100 kilo-Ohms, and the resistor 184 has a resistance of 100 mega-Ohms.

The light emitting device 65 is further electrically coupled to the output terminal 194 of the second comparator 180. The light emitting device 65 is further configured to emit light in response to the second isolation resistance fault signal.

Figure 3:
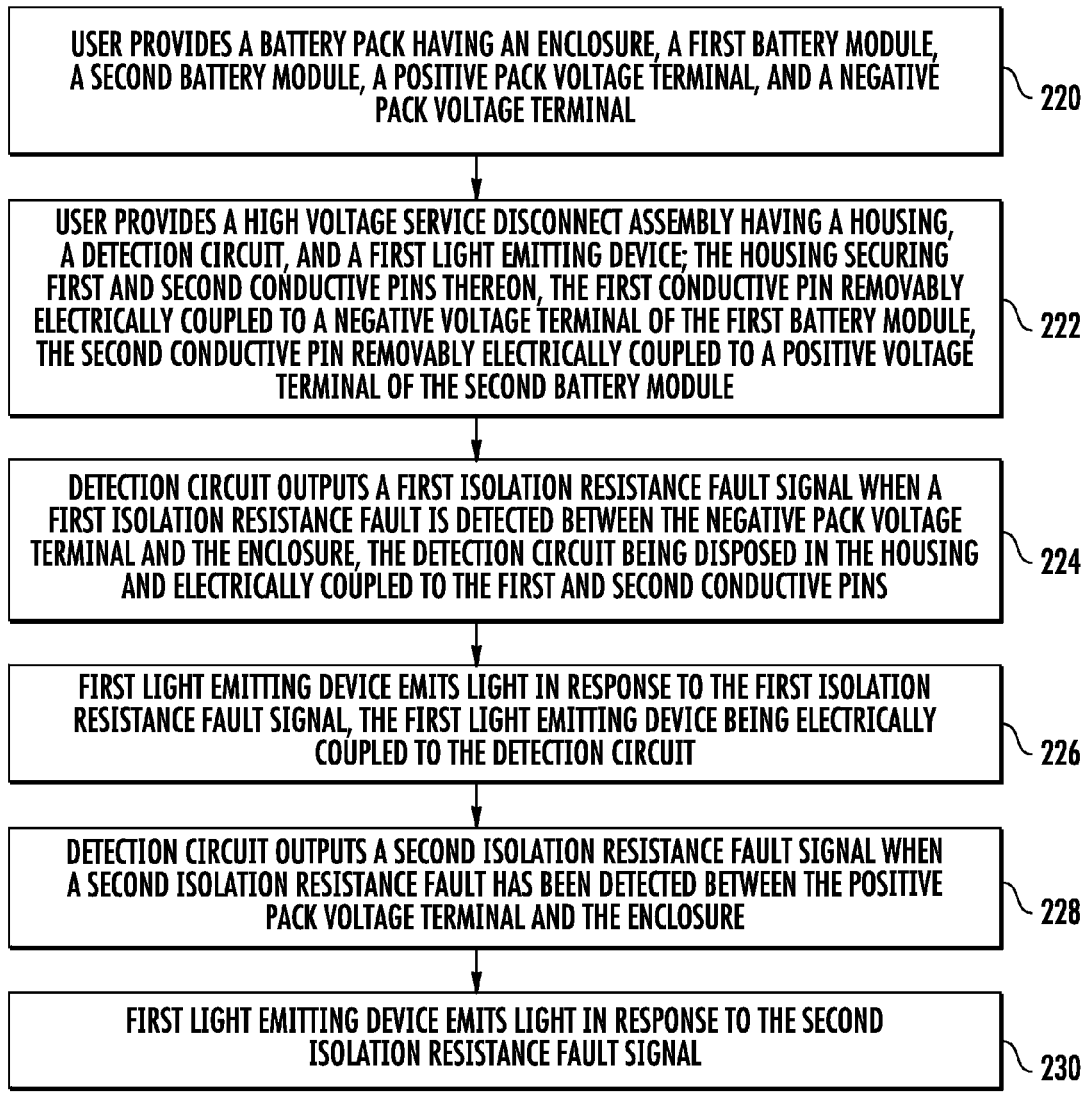
FIG. 3 is a flowchart of a method for determining an isolation resistance fault of a battery pack utilizing the high voltage service disconnect assembly of FIG. 1, in accordance with another exemplary embodiment.

Referring to FIGS. 1 and 3, a flowchart of a method for determining an isolation resistance fault of the battery pack 20 utilizing the high voltage service disconnect assembly 30 in accordance with another exemplary embodiment will now be explained.

At step 220, a user provides the battery pack 20 having the enclosure 40, the first battery module 42, the second battery module 43, the positive pack voltage terminal 52, and the negative pack voltage terminal 54.

At step 222, the user provides the high voltage service disconnect assembly 30 having the housing 60, the detection circuit 64, and the first light emitting device 65. The housing 60 secures the first and second conductive pins 62, 63 thereon. The first conductive pin 62 is removably electrically coupled to the negative voltage terminal 56 of the first battery module 42. The second conductive pin 63 is removably electrically coupled to the positive voltage terminal 57 of the second battery module 43.

At step 224, the detection circuit 64 outputs a first isolation resistance fault signal when a first isolation resistance fault is detected between the negative pack voltage terminal 54 and the enclosure 40. The detection circuit 64 is disposed in the housing 60 and is electrically coupled to the first and second conductive pins 62, 63.

At step 226, the first light emitting device 65 emits light in response to the first isolation resistance fault signal. The first light emitting device 65 is electrically coupled to the detection circuit 64.

At step 228, the detection circuit 64 outputs a second isolation resistance fault signal when a second isolation resistance fault has been detected between the positive pack voltage terminal 52 and the enclosure 40.

At step 230, the first light emitting device 65 emits light in response to the second isolation resistance fault signal.

Figure 4:
FIG. 4 is a flowchart of a method step utilized in an alternative method for determining an isolation resistance fault of a battery pack.

Referring to FIGS. 1, 2 and 4, in an alternative embodiment, the electric vehicle power system 10 additionally has a light emitting device 250 that is electrically coupled to the output terminal 194 of the second comparator 180. Thus, in this alternative embodiment, the output terminal 194 is electrically coupled to the light emitting device 250 instead of the light emitting device 65. Referring to FIG. 4, during operation in this alternative embodiment, the step 240 is implemented such that the light emitting device 250 emits light in response to the second isolation resistance fault signal, instead of the light emitting device 65. Also, the light emitting device 250 could be configured to emit light having a first color, and the light emitting device 65 could be configured to emit light having a second color which is different than the first color.

The high voltage service disconnect assembly 30 and the method for determining an isolation resistance fault in the battery pack 20 provide a substantial advantage over other assemblies and methods. In particular, the high voltage service disconnect assembly 30 and the method provide a technical effect of effectively and quickly determining an isolation resistance fault in a battery pack of an electric vehicle and providing a visual indication that the isolation resistance fault exists.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A high voltage service disconnect assembly for determining an isolation resistance fault of a battery pack, the battery pack having an enclosure, a first battery module, a second battery module, a positive pack voltage terminal, a negative pack voltage terminal, comprising:
    a housing of the high voltage service disconnect assembly that secures first and second conductive pins thereon, the first conductive pin being removably electrically coupled to a negative voltage terminal of the first battery module, the second conductive pin being removably electrically coupled to a positive voltage terminal of the second battery module, the first conductive pin being further electrically coupled in series with the second conductive pin within the housing of the high voltage service disconnect assembly;
    a detection circuit being disposed in the housing of the high voltage service disconnect assembly and electrically coupled to the first and second conductive pins, the detection circuit outputting a first isolation resistance fault signal when a first isolation resistance is detected between the negative pack voltage terminal and the enclosure; and
    a first light emitting device electrically coupled to the detection circuit, the first light emitting device emitting light in response to the first isolation resistance fault signal.

2. The high voltage service disconnect assembly of claim 1, wherein the detection circuit includes a first comparator circuit having a first comparator, a first voltage divider circuit, and a first resistor; the first comparator having a first non-inverting input terminal, a first inverting input terminal, and a first output terminal; the first non-inverting input terminal being electrically coupled through the first voltage divider circuit to the negative voltage terminal of the first battery module, the first inverting input terminal being electrically coupled to the enclosure, the first inverting input terminal being further electrically coupled through the first resistor to the negative voltage terminal of the first battery module, the first comparator configured to output the first isolation resistance fault signal on the first output terminal when a first voltage on the first non-inverting input terminal is greater than a second voltage on the first inverting input terminal indicating that the first isolation resistance fault has been detected between the negative pack voltage terminal and the enclosure; and
    the first light emitting device being electrically coupled to the first output terminal.

3. The high voltage service disconnect assembly of claim 2, wherein the first voltage divider circuit includes second and third resistors and a first electrical node electrically coupled between the second and third resistors, the second and third resistors being electrically coupled in series between the negative voltage terminal of the first battery module and a second electrical node, the first electrical node being electrically coupled to the first non-inverting input terminal such that the first non-inverting input terminal is electrically coupled through the first voltage divider circuit to the negative voltage terminal of the first battery module.

4. The high voltage service disconnect assembly of claim 1, wherein the detection circuit is further configured to output a second isolation resistance fault signal when a second isolation resistance fault has been detected between the positive pack voltage terminal and the enclosure.

5. The high voltage service disconnect assembly of claim 4, wherein the detection circuit further comprises a second comparator circuit having a second comparator, a second voltage divider circuit, and a second resistor; the second comparator having a second non-inverting input terminal, a second inverting input terminal, and a second output terminal; the second inverting input terminal being electrically coupled through the second voltage divider circuit to the positive voltage terminal of the second battery module, the second non-inverting input terminal being electrically coupled to the enclosure, the second non-inverting input terminal being further electrically coupled through the second resistor to a first electrical node, the second comparator configured to output the second isolation resistance fault signal on the second output terminal when a first voltage on the second non-inverting input terminal is greater than a second voltage on the second inverting input terminal indicating that the second isolation resistance fault has been detected between the positive pack voltage terminal and the enclosure.

6. The high voltage service disconnect assembly of claim 5, wherein the second voltage divider circuit further includes second and third resistors and a second electrical node electrically coupled between the second and third resistors, the second and third resistors being electrically coupled in series between the positive voltage terminal of the second battery module and the first electrical node, the second electrical node being further electrically coupled to the second inverting input terminal such that the second inverting input terminal is electrically coupled through the second voltage divider circuit to the positive voltage terminal of the second battery module.

7. The high voltage service disconnect assembly of claim 5, wherein the first light emitting device being further electrically coupled to the second output terminal, the first light emitting device further configured to emit light in response to the second isolation resistance fault signal.

8. The high voltage service disconnect assembly of claim 5, further comprising a second light emitting device electrically coupled to the second output terminal, the second light emitting device further configured to emit light in response to the second isolation resistance fault signal.

9. The high voltage service disconnect assembly of claim 1, wherein the first light emitting device is disposed on an exterior surface of the enclosure.

10. The high voltage service disconnect assembly of claim 1, further comprising a fuse being electrically coupled in series between the first and second conductive pins.

11. The high voltage service disconnect assembly of claim 1, wherein an electrical short circuit is present between the first and second conductive pins.

12. A method for determining an isolation resistance fault of a battery pack utilizing a high voltage service disconnect assembly, the battery pack having an enclosure, a first battery module, a second battery module, a positive pack voltage terminal, and a negative pack voltage terminal, the method comprising:

providing the high voltage service disconnect assembly having a housing, a detection circuit, and a first light emitting device; the housing securing first and second conductive pins thereon, the first conductive pin being removably electrically coupled to a negative voltage terminal of the first battery module, the second conductive pin being removably electrically coupled to a positive voltage terminal of the second battery module, the first conductive pin being further electrically coupled in series with the second conductive pin within the housing of the high voltage service disconnect assembly;

outputting a first isolation resistance fault signal from the detection circuit when a first isolation resistance fault is detected between the negative pack voltage terminal and the enclosure, the detection circuit being electrically coupled to the first and second conductive pins; and emitting light from the first light emitting device electrically coupled to the detection circuit in response to the first isolation resistance fault signal.

13. The method of claim 12, further comprising outputting a second isolation resistance fault signal from the detection circuit when a second isolation resistance fault has been detected between the positive pack voltage terminal and the enclosure.

14. The method of claim 13, further comprising emitting light from the first light emitting device in response to the second isolation resistance fault signal.

15. The method of claim 13, further comprising emitting light from a second light emitting device in response to the second isolation resistance fault signal.

16. A high voltage service disconnect assembly for determining an isolation resistance fault of a battery pack, the battery pack having an enclosure, a first battery module, a second battery module, a positive pack voltage terminal, a negative pack voltage terminal, comprising:

a housing of the high voltage service disconnect assembly that secures first and second conductive pins thereon, the first conductive pin being removably electrically coupled to a negative voltage terminal of the first battery module, the second conductive pin being removably electrically coupled to a positive voltage terminal of the second battery module;

a fuse being disposed in the housing of the high voltage service disconnect assembly and being electrically coupled in series between the first and second conductive pins within the housing of the high voltage service disconnect assembly; and a detection circuit being disposed in the housing of the high voltage service disconnect assembly and electrically coupled to the first and second conductive pins, the detection circuit outputting a first isolation resistance fault signal when a first isolation resistance fault is detected between the negative pack voltage terminal and the enclosure, the detection circuit outputting a second isolation resistance fault signal when a second isolation resistance fault has been detected between the positive pack voltage terminal and the enclosure.

17. The high voltage service disconnect assembly of claim 16, further comprising a first light emitting device electrically coupled to the detection circuit, the first light emitting device emitting light in response to the first isolation resistance fault signal, the first light emitting device further emitting light in response to the second isolation resistance fault signal.

* * * * *